(12) United States Patent
Pfizenmaier et al.

(10) Patent No.: US 11,320,494 B2
(45) Date of Patent: May 3, 2022

(54) COMPENSATION DEVICE FOR COMPENSATING FOR LEAKAGE CURRENTS

(71) Applicant: Dr. Ing. h.c. F. Porsche Aktiengesellschaft, Stuttgart (DE)

(72) Inventors: Tim Pfizenmaier, Leonberg (DE); Daniel Spesser, Illingen (DE); Florian Mayer, Freiberg am Neckar (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 46 days.

(21) Appl. No.: 16/994,748

(22) Filed: Aug. 17, 2020

(65) Prior Publication Data

US 2021/0048484 A1 Feb. 18, 2021

(30) Foreign Application Priority Data

Aug. 15, 2019 (DE) ..................... 10 2019 121 961.2

(51) Int. Cl.
*G01R 31/52* (2020.01)
*G01R 31/27* (2006.01)
(Continued)

(52) U.S. Cl.
CPC ........... *G01R 31/52* (2020.01); *G01R 31/002* (2013.01); *G01R 31/27* (2013.01); *G01R 31/2803* (2013.01); *G01R 31/2879* (2013.01)

(58) Field of Classification Search
CPC ...... G01R 31/52; G01R 31/002; G01R 31/27; G01R 31/2803; G01R 31/2879;
(Continued)

(56) References Cited

U.S. PATENT DOCUMENTS 6,388,451 B1 5/2002 Burba et al.
10,139,848 B1 11/2018 Treichler et al.
(Continued)

FOREIGN PATENT DOCUMENTS

DE 101 39 028 5/2002

OTHER PUBLICATIONS

German Search Report dated May 6, 2020.

*Primary Examiner* — Farhana A Hoque
(74) *Attorney, Agent, or Firm* — Gerald E. Hespos; Michael J. Porco; Matthew T. Hespos

(57) ABSTRACT

A compensation device (20) for compensating for leakage currents has a differential current measuring device (22), a supply network detection device (42; 45), a control device (26), an amplifier (27), a compensation current selection device (36) and a feed-in device (39, 41). The supply network detection device (42; 45) generates a second signal (V_GRID; V_ES) characterizing the supply network (L1, L2, L3, N) connected to the active conductors (51, 52, 53, 54) and to supply it to the control device (26). The compensation current selection device (36) feeds in the compensation current (I_COMP) on the basis of a third signal (V_SEL) on at least one of the at least two different active conductors (51, 54), and the third signal (V_SEL) is dependent on the second signal (V_GRID; V_ES) to select at least one active conductor (51, 54) suitable for the connected supply network for the feed-in operation.

11 Claims, 4 Drawing Sheets

(51) Int. Cl.
*G01R 31/00* (2006.01)
*G01R 31/28* (2006.01)

(58) Field of Classification Search
CPC ..... Y02T 10/70; Y02T 10/7072; Y02T 90/12; B60L 3/0069; B60L 3/0023; B60L 53/30; H02J 3/00; H02J 7/0029; H02J 7/02; H02H 1/04; H02H 3/17; H02H 3/33; H02H 3/46; H02H 9/02; H02H 9/08
See application file for complete search history.

(56) References Cited

U.S. PATENT DOCUMENTS

| | | |
|---|---|---|
| 2004/0189337 A1 | 9/2004 | Hsu et al. |
| 2011/0057707 A1* | 3/2011 | Bronczyk .......... G01R 31/3008 327/332 |
| 2013/0044880 A1 | 2/2013 | Bettenwort et al. |
| 2014/0210411 A1 | 7/2014 | Fluxa et al. |
| 2014/0327371 A1 | 11/2014 | Radermacher et al. |
| 2016/0154047 A1 | 6/2016 | Alcouffe et al. |

* cited by examiner

COMPENSATION DEVICE FOR COMPENSATING FOR LEAKAGE CURRENTS

CROSS REFERENCE TO RELATED APPLICATION

This application claims priority under 35 USC 119 to German Patent Appl. No. 10 2019 121 961.2 filed on Aug. 15, 2019, the entire disclosure of which is incorporated herein by reference.

BACKGROUND

Field of the Invention

The invention relates to a compensation device for compensating for leakage currents, in particular for use in the charging device of a vehicle.

Related Art

Leakage currents are electrical currents which flow under conventional operating conditions in an undesirable current path, for example from one of the outer conductors (L1 to L3) to the protective conductor (PE). Such leakage currents occur in practice, for example, as a result of filter capacitors of a network filter which are connected, on the one hand, to a DC voltage path, for example, and are connected, on the other hand, to the protective conductor (PE).

US 2004/0189337 A1 discloses a leakage current monitor for an integrated circuit.

US 2011/0057707 A1 discloses a multiplexer with leakage current capture.

US 2014/0327371 A1 discloses a power supply unit for an LED with phase gating control and compensation.

US 2016/0154047 A1 discloses leakage current capture with a test circuit.

US 2013/0043880 A1 discloses a device for determining and compensating for a fault current.

An object of the invention is to provide a compensation device for compensating for leakage currents and a vehicle having such a compensation device.

SUMMARY

A compensation device for compensating for leakage currents has a differential current measuring device, a supply network detection device, a control device, an amplifier, a compensation current selection device and a feed-in device. The differential current measuring device is designed to capture a first signal characterizing the differential current of the active conductors and to supply it to the control device. The supply network detection device is designed to generate a second signal characterizing the supply network connected to the active conductors and to supply it to the control device. The control device is designed to generate a compensation preset signal suitable for the compensation from the first signal and to supply it to the amplifier. The amplifier is designed to generate a compensation current on the basis of the compensation preset signal. The feed-in device is designed to make it possible to feed in the compensation current on at least two different active conductors. The compensation current selection device is designed to feed in the compensation current on the basis of a third signal on at least one of the at least two different active conductors, and the control device is designed to generate the third signal on the basis of the second signal in order to select at least one active conductor suitable for the connected supply network for the feed-in operation. Influencing the compensation current selection device on the basis of the connected supply network makes it possible to feed in the compensation current on a suitable active conductor.

According to one preferred embodiment, the supply network detection device has at least one voltage measuring device and is designed to measure the voltage on at least one of the active conductors using the at least one voltage measuring device in order to detect the connected supply network. The connected supply network can be detected in a comparatively reliable manner by measuring the voltage.

According to one preferred embodiment, the compensation device has a safety device, which safety device has a switch, which switch is connected, on the input side, to a first line, which first line is connected to the amplifier, and which switch is designed to connect the first line either to a second line in a first state or to a third line in a second state, wherein the second line is connected to a protective conductor connection, wherein the third line is connected to the compensation current selection device, and wherein the switch can be controlled by the control device. Providing the switch, with the possibility of connecting the first line to a protective conductor connection, makes it possible to test the amplifier.

According to one preferred embodiment, the switch is in the form of a relay. A relay is particularly well suited as a switch since it has a low resistance in the conductive state and has a high insulation resistance in the non-conductive state. In addition, very fast switching is not required during use.

According to one preferred embodiment, the control device is designed to enable a functional test, during which functional test the control device controls the switch in such a manner that it is in the first state, and during which functional test the control device supplies a compensation preset signal to the amplifier, which compensation preset signal causes a compensation current in order to check the function of the amplifier without feeding in the compensation current via the feed-in device. This diagnostic possibility increases the safety and checkability of the compensation device.

According to one preferred embodiment, before a supply network is connected to the active conductors, the control device changes the switch to the first state, and the control device changes the switch to the second state only under predefined conditions, which predefined conditions comprise
- the fact that the supply network is connected to the active conductors, and
- the fact that the third signal has been generated on the basis of the second signal.

Safer operation is possible as a result of these predefined conditions.

According to one preferred embodiment, the first line is connected to the third line via a capacitor in order to make it possible to transmit pulses, which occur on the third line, to the first line even in the first state of the switch. As a result of this measure, the compensation device can carry out a measurement even in the first state of the switch and can check whether the feed-in device is connected to a phase or to a neutral conductor.

According to one preferred embodiment, the compensation device has a compensation current measuring device, which compensation current measuring device is designed to measure the compensation current, to generate a fourth signal characterizing this compensation current and to supply the fourth signal to the control device. As a result of the measurement of the compensation current, the control device can check whether the compensation is functioning correctly. If this is not the case, the compensation device can increase or reduce the compensation current, for example. The reliability is increased as a result.

According to one preferred embodiment, if a supply network having a neutral conductor is detected by the supply network detection device, the compensation device is designed to control the compensation current selection device in such a manner that the compensation current is fed in by the feed-in device on that active conductor to which the neutral conductor is connected. Feeding into the neutral conductor is advantageous since the voltage on the neutral conductor is low relative to the voltage on the phases/outer conductors. Lower voltages enable smaller and more cost-effective power supply units for producing the required voltages.

The object is also achieved by means of the subject matter of claim 10.

A vehicle has a charging device for a traction battery, which charging device has a rectifier and a traction battery connected directly or indirectly to the rectifier, wherein the traction battery is electrically coupled to the active conductors, and wherein the charging device has a compensation device as claimed in one of the preceding claims. In the case of a vehicle with electrical coupling, leakage currents produced inside the vehicle can also be measured outside the vehicle and can result in the tripping of a fuse of the supply network. The use of the compensation device is therefore particularly advantageous in this case.

Further details and advantageous developments of the invention emerge from the exemplary embodiments, which are described below, are illustrated in the drawings and should in no way be understood as a restriction of the invention, and from the subclaims.

DETAILED DESCRIPTION

Figure 1:
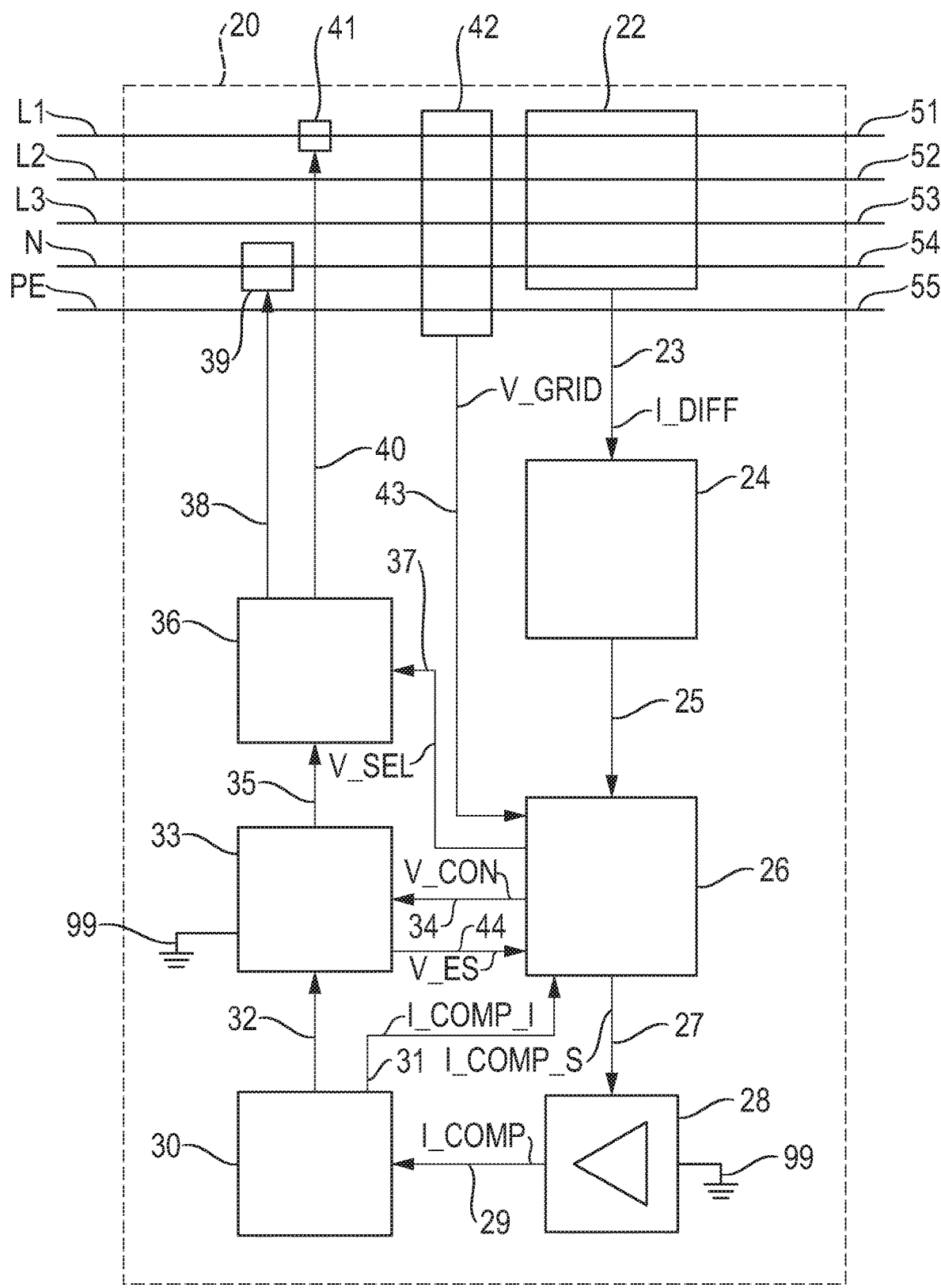
FIG. 1 shows an exemplary embodiment of a compensation device.

FIG. 1 shows an exemplary embodiment of a compensation device 20. Five conductors 51, 52, 53, 54 and 55 are provided. In the case of a three-phase network, the conductors 51 to 53, for example, can be connected to the outer conductors (phases) L1, L2 and L3. The conductor 54 is connected to the neutral conductor N and the conductor 55 is connected to the protective conductor PE. The conductors needed to conduct current, for example the conductors 51 to 53 for the outer conductors L1, L2, L3 of the supply network and the conductor 54 for the neutral conductor N of the supply network, are referred to as active conductors. A differential current measuring device measures the differential current of the active conductors 51 to 54. The differential current measuring device 22 may be designed as a summation current transformer, for example, in the form of a winding around the active conductors 51 to 54. If no fault currents or leakage currents occur, the sum of the currents through the conductors 51 to 54, and therefore also the current through the winding, is zero. If, in contrast, a leakage current flows from the phase L1 to the protective conductor PE via a Y capacitor of a network filter, for example, the differential current measuring device 22 reveals the resulting differential current. It is also possible to separately measure, for example, the summation current through the conductors 51 to 53, on the one hand, and the summation current through the conductor 54, on the other hand, and to then calculate the sum or difference between the two values on the basis of the respective winding direction. The signal I_DIFF from the differential current measuring device 22 is supplied to a signal conditioning device 24 via a line 23. An A/D conversion, for example, is carried out in the signal conditioning device 24. The signal conditioning device 24 transmits a corresponding signal to the control device 26 via a line 25. The control device 26, which is in the form of a microcontroller or a computing unit for example, uses the determined differential current to calculate a value or a signal I_COMP_S for a suitable compensation current. This value I_COMP_S is supplied to an amplifier 28 via a line 27, and the amplifier 28 generates a corresponding compensation current I_COMP. For this purpose, the amplifier 28 is connected to the protective conductor 99 in order to enable a current from or to the protective conductor 99. The amplifier 28 is connected to a compensation current measuring device 30 via a line 29. The compensation current measuring device 30 measures the compensation current and outputs a value or a signal I_COMP_I to the control device 26 via a line 31. The compensation current reaches a safety device 33 via a line 32. The safety device 33 can be controlled by the control device 26 with a signal V_CON via a line 34. In addition, the safety device 33 is connected to the protective conductor 99 in order to enable a current flow from or to the protective conductor 99. The safety device 33 is connected to a compensation current selection device 36 via a line 35. The compensation current selection device 36 can be controlled by the control device 26 via a line 37 which can be used to transmit a signal V_SEL. The compensation current selection device 36 can supply the compensation current to a first feed-in device 39 via a line 38 and/or can supply it to a second feed-in device 41 via a line 40.

Figure 5:
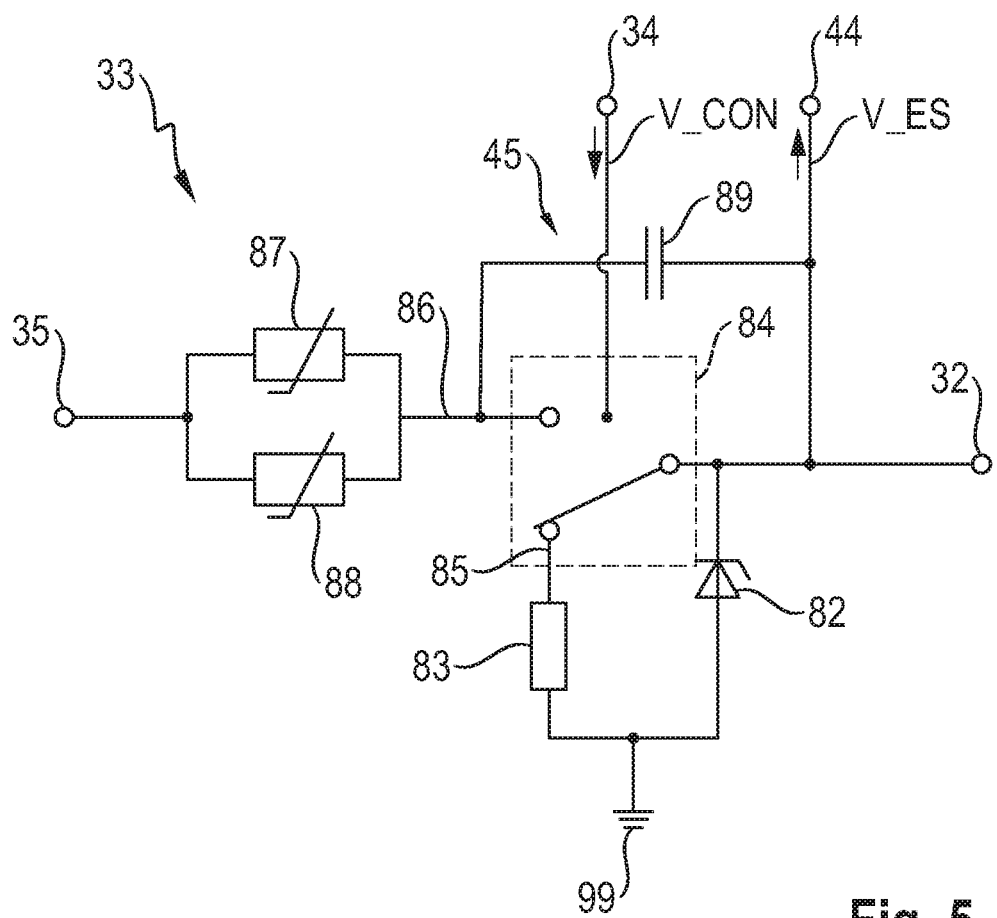
FIG. 5 shows an exemplary embodiment of a safety device from FIG. 1.

A first supply network detection device 42 is provided in order to detect the supply network connected to the conductors 51 to 55 and to output a signal V_GRID to the control device 26 via a line. For this purpose, the supply network detection device 42 measures the voltages at the connections 51 to 55, for example. This can be carried out directly in the supply network detection device 42 or in the control device 26, for example. A voltage measuring device 42, 26 is therefore preferably provided. In the case of a central European three-phase network, the conductors 51 to 55 are connected, for example, to the connections L1, L2, L3, N and PE illustrated on the left. In the case of a US split-phase network, the connection HOT1 is connected to the conductor 51, the connection HOT2 phase-shifted through 180° is connected to the conductor 54 and the protective conductor PE is connected to the conductor 55. In the case of a single-phase central European network, either the conductor 51 is connected to L1 and the conductor 54 is connected to N or the conductor 51 is connected to N and the conductor 54 is connected to L1. The assignment is therefore not necessarily unambiguous. An alternative or addition to the first supply network detection device 42 is a second supply network detection device 45 which is shown in FIG. 5 and, in the exemplary embodiment, is integrated in the safety device 33 and outputs a signal V_ES to the control device 26 via a line 44, as described in FIG. 5. In order to increase safety, both the first supply network detection device 42 and the second supply network detection device 45 (cf. FIG. 5) can be provided.

The feed-in devices 39 and 41 can carry out the feed-in operation by means of capacitive coupling or inductive coupling, for example.

In the case of a supply network having a neutral conductor N, the feed-in operation is preferably carried out into the neutral conductor since the voltage on the neutral conductor N is normally low and the supply voltage for the feed-in operation can therefore be low in comparison with the voltages on the phases. Before a supply network L1, N or L1, L2, L3, N, PE or HOT1, HOT2 is connected to the active conductors 51 to 54, the control device 26 preferably changes the switch 84 from FIG. 5 to the first state. This prevents a phase voltage from going further than the safety device 33, for example if the phase L1 is connected to the connection 54. The control device 26 preferably changes the switch 84 from FIG. 5 to the second state only under predefined conditions, which predefined conditions comprise the fact that the supply network L1, L2, L3, N, PE is connected to the active conductors 51 to 54, and the fact that the signal V_SEL has been generated on the basis of the signal V_GRID, V_ES.

Connecting the supply network first makes it possible to detect the supply network and it is ensured that the correct feed-in device has been selected via the compensation current selection device 36 only after the signal V_SEL has been generated.

The signal I_COMP_S for the compensation current I_COMP is calculated, for example, by determining the frequency spectrum of the differential current or of the signal I_DIFF, in which case a frequency range of 20 Hz to 300 kHz may be sufficient, for example. The frequency spectrum contains corresponding amplitudes, and the signal I_COMP_S is generated with a phase shift of 180° (out of phase) in order to cause corresponding compensation. Other calculations are also possible in which the integral is calculated.

Figure 2:
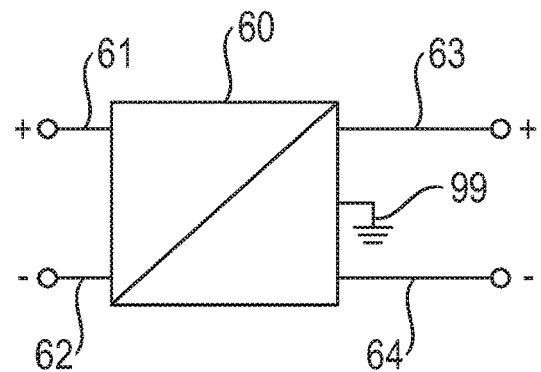
FIG. 2 shows a power supply unit for a compensation current.

FIG. 2 shows a power supply unit 60 for generating a DC voltage at the outputs 63, 64 from a DC voltage at the inputs 61, 62. The voltage between the inputs 61, 62 is 12 V, for example. The voltage at the output 63 is +15 V, for example, and the voltage at the output 64 is −15 V, for example. The power supply unit 60 is connected to the protective conductor 99 in order to enable a potential reference with respect to the latter.

Figure 3:
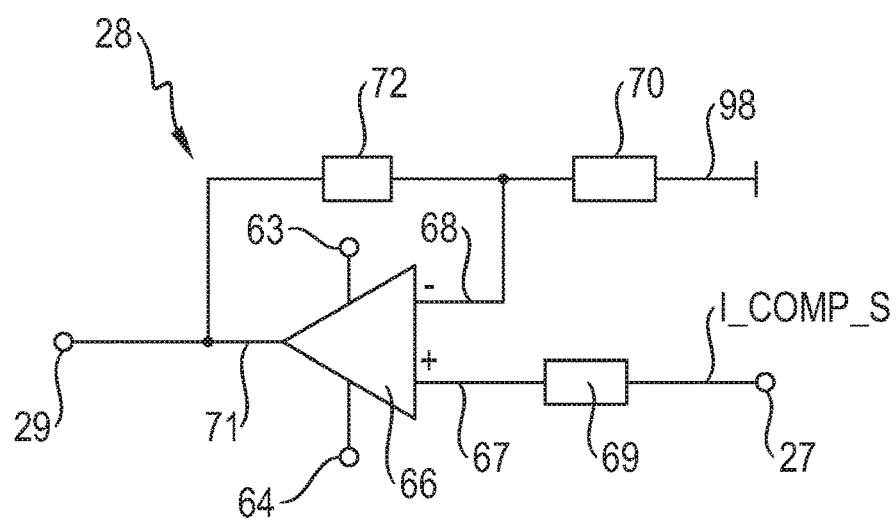
FIG. 3 shows an exemplary embodiment of an amplifier of the compensation device from FIG. 1.

FIG. 3 shows an exemplary embodiment of the amplifier 28. In the exemplary embodiment, the amplifier 28 is in the form of a differential amplifier and has an operational amplifier 66 with a positive (non-inverting) input 67 and a negative (inverting) input 68 and an output 71. In order to supply voltage, the operational amplifier 66 is connected to the connections 63 and 64 of the power supply unit 60 from FIG. 2. The line 27 is connected to the positive input 67 via a resistor 69. The negative input 68 is connected to ground (GND) 98 via a resistor 70. In addition, the negative input 68 is connected to the output 71 via a resistor 72. The output 71 is connected to the line 29. The gain of the amplifier 28 must be selected on the basis of the signal I_COMP_S, and a gain of a factor of 10 was used in the exemplary embodiment.

The following component values are stated by way of example but not in a restrictive manner:

Resistor 69: 13 kohms
Resistor 70: 330 ohms
Resistor 72: 3300 ohms

An alternative to the amplifier shown is a digital/analog converter or a class-D amplifier.

Figure 4:
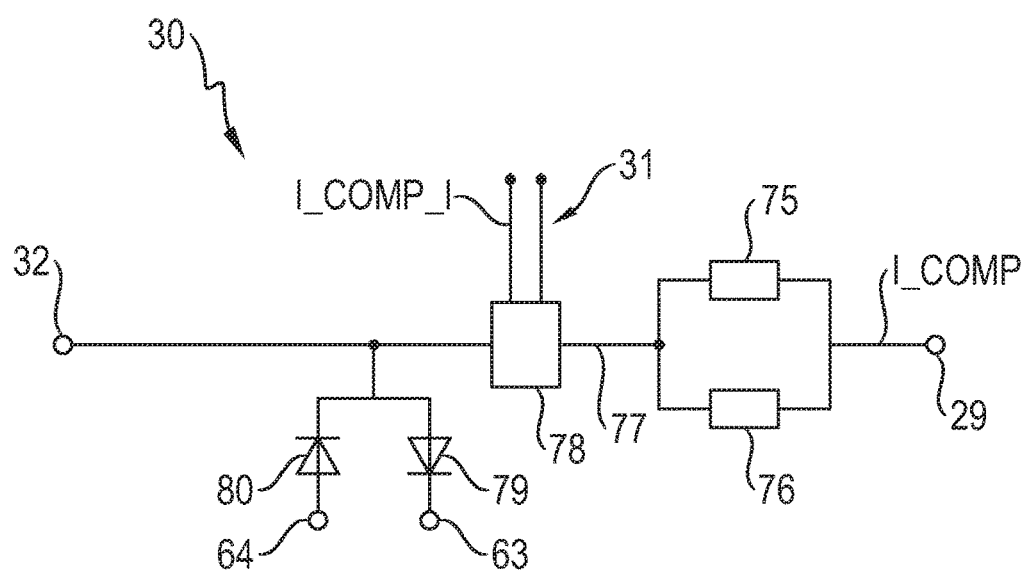
FIG. 4 shows an exemplary embodiment of a compensation current measuring device from FIG. 1.

FIG. 4 shows the compensation current measuring device 30. The line 29 with the compensation current I_COMP is connected to a line 77 via two resistors 75, 76 (for example each of 100 ohms) which are connected in parallel. A current sensor 78 is provided on the line 77, for example a magnetic current sensor with a Hall probe or a current sensor using the magnetoresistive effect. The signal I_COMP_I characterizing the compensation current I_COMP, which is a voltage signal for example, is supplied to the control device 26 from FIG. 1 via the line 31. The line 77 is connected to the connection 63 of the power supply unit 60 via a diode 79 and is connected to the connection 64 of the power supply unit 60 via a diode 80. The cathode of the diode 79 faces the connection 63 and the anode of the diode 80 faces the connection 64.

The resistors 75, 76 and the diodes 79, 80 are used to limit the current. If the voltage on the line 77 becomes greater than the voltage at the connection 63, the current flows away to the connection 63 and, if the voltage on the line 77 becomes lower than the voltage at the connection 64, a current flows from the connection 64 to the line 77. This limits the voltage on the line 77 to the voltages at the connections 63 and 64.

The compensation current is then output via the line 32.

FIG. 5 shows the safety device 33. The line 32 is connected to a switch 84. On the basis of the signal V_CON on the line 34, the switch 84 makes it possible to connect the (first) line 32 either to a (second) line 85 or to a (third) line 86. The connection to the second line 85 can be referred to as a first state Z1 and the connection to the third line 86 can be referred to as a second state Z2. The line 32 is connected to the protective conductor 99 via a Zener diode 82 and the line 85 is connected to the protective conductor 99 via a resistor 83. The line 32 is connected to the line 86 via a capacitor 89. The line 86 is connected to the line 35 via two PTC thermistors 87, 88 which are connected in parallel.

The switch 84 is preferably in the form of a relay since relays have a low resistance in the conductive state and have a high insulation resistance and a high reverse voltage in the non-conductive state.

The Zener diode 82 limits the voltage on the line 32 to a predefined value according to the breakdown voltage. If the line 32 is connected to the line 85 via the switch 84, there is a connection between the conductor 32 and the protective line 99 via the resistor 83. The resistor 83 has a resistance of 10 ohms, for example. This enables a self-diagnosis of the control device 26 from FIG. 1 by virtue of the latter outputting a compensation current I_COMP via the amplifier 28 but allowing it to flow in the direction of the protective conductor 99 and not in the direction of the active conductors 51 to 54. A current flow can therefore be generated for diagnostic purposes even if no network supply is connected to the active conductors 51 to 54 from FIG. 1, for example. In addition, even if a supply network is connected, the compensation current I_COMP is not coupled into the active conductors L1, L2, L3 or N, and tripping of a fuse when carrying out a diagnosis is avoided.

A current pulse can reach the line 32 via the capacitor 89 from the left, even without the lines 32, 86 being connected by the switch 84. The level of the voltage is limited by the Zener diode 82. The line 32 is connected to the control device 26 from FIG. 1 via the line 44 and can output a signal V_ES to the control device 26. The voltage of the signal V_ES makes it possible to measure voltage pulses or an AC voltage which is/are present on the line 35 and can flow to the protective conductor 99 via the resistor 83. A voltage measuring device 33, 26 which is provided either in the safety device 33 or in the control device 26, for example an A/D converter or a comparator, can be used to evaluate the voltage. As a result, it is possible to determine whether the line 35 is connected to the neutral conductor N via the compensation current selection device 36 (no voltage fluctuation) or to the phase L1 (AC voltage signal). The capacitor 89 therefore forms the second supply network detection device 45 together with the switch 84.

The PTC thermistors 87, 88 are an additional safety measure. In the case of high currents, the PTC thermistors 87, 88 heat up and their resistance value increases as a result. This results in additional current limitation in the case of high currents.

Figure 6:
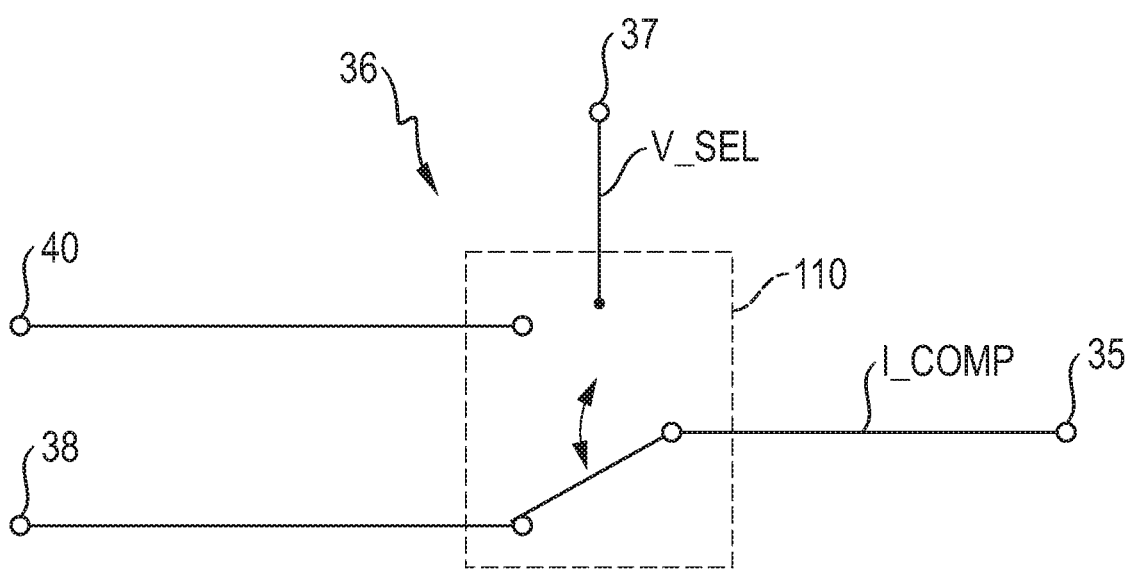
FIG. 6 shows an exemplary embodiment of a compensation current selection device from FIG. 1.

FIG. 6 shows an exemplary embodiment of the compensation current selection device 36 from FIG. 1. A switch 110 is provided, the input of which is connected to the line 35 which can be used to supply the compensation current 35. The switch 110 can be controlled using the signal V_SEL via the line 37, and the input of the switch 110 can be connected to the line 38 or to the line 40 depending on the signal V_SEL. It is also possible to use a switch which, as an alternative to individual supply, makes it possible to conduct the compensation current I_COMP to both conductors 38, 40.

Figure 7:
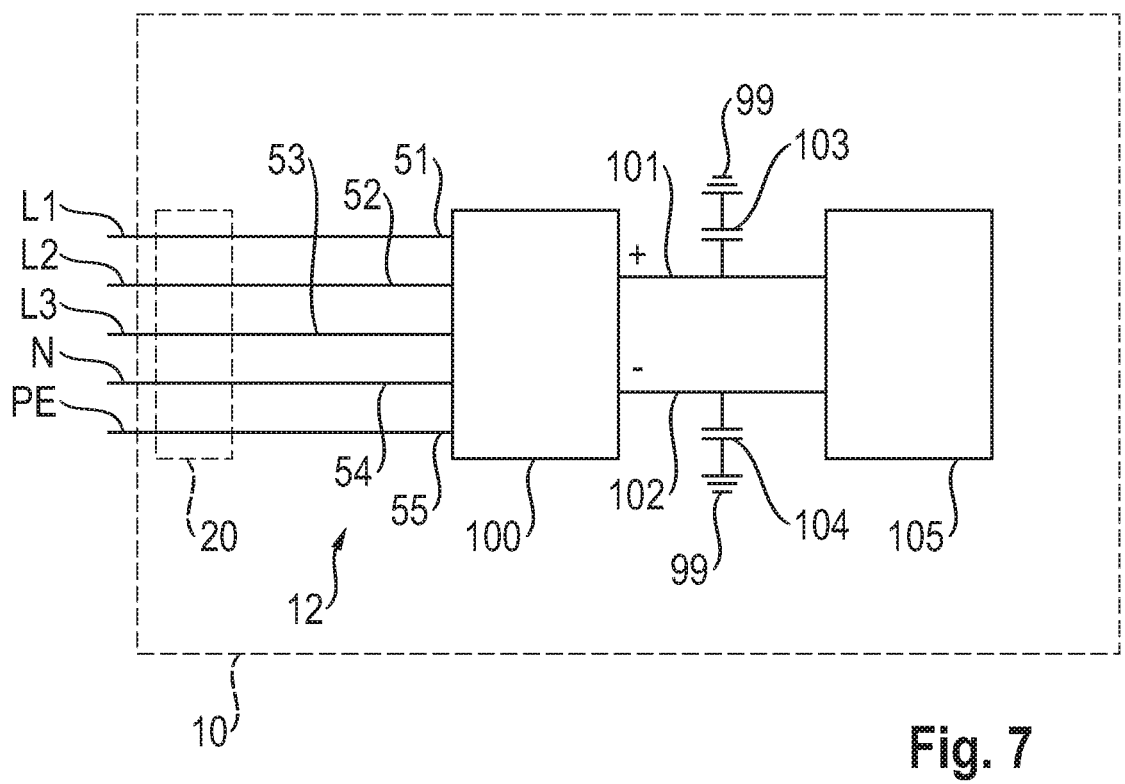
FIG. 7 shows a use of the compensation device from FIG. 1 in a vehicle.

FIG. 7 shows an exemplary embodiment of the use of the conductors 51 to 55 with the schematically indicated compensation device 20 in a vehicle 10, in particular in an electric vehicle or a hybrid vehicle. The conductors 51 to 53 (phase conductors or outer conductors), the conductor 54 (neutral conductor) and the conductor 55 (protective conductor) are connected to a rectifier (AC/DC converter) 100, and two conductors 101 (+) and 102 (−) are provided at the output of the rectifier 100, on which conductors a DC voltage is present. The arrangement can therefore be used as a charging device 12. The conductor 101 is connected to the protective conductor 99 via a capacitor 103, and the conductor 102 is connected to the protective conductor 99 via a capacitor 104. The conductors 101, 102 are connected to a load 105, for example a traction battery, directly or indirectly (for example via an additional DC/DC converter). The capacitors 103, 104 act as EMC filters or network filters and are also referred to as Y capacitors or filter capacitors. During operation, a current can flow to the protective conductor 99 (PE) via the capacitors 103, 104. Since the voltage on the conductors 101, 102 is generated using the current through the active conductors L1, L2, L3 and N, the leakage current to the protective conductor 99 results in a differential current in the active conductors, which differential current can result in tripping of a fuse or a residual current circuit breaker of the supply connection if a predefined limit value is exceeded. Conventional limit values of the fuses in the supply networks are 3.5 mA and 10 mA and 30 mA, for example.

The compensation device 20 can compensate for the leakage currents to such an extent that the fuse of the supply network does not trip during normal operation on account of the limit value for leakage currents being exceeded.

This is particularly advantageous in charging devices 12 for electric vehicles or hybrid vehicles which have electrical coupling between the DC intermediate circuit 101, 102 and the conductors 51 to 54 and/or between the load 105 and the conductors 51 to 54. Unlike in vehicles with DC isolation, as may be the case in vehicles with transformers in the rectifier 100 or in a DC/DC converter for example, the leakage currents are added in the case of electrical coupling and are visible in the supply network. The use of the compensation device 20 in vehicles with electrical coupling is therefore particularly advantageous.

Naturally, various alterations and modifications are possible within the scope of the present invention.

In addition to the claimed elements, the circuits specifically shown contain further elements for increasing safety or for further functionalities. Each of these elements, which is described in the text, may be a preferred development per se and can preferably be used independently as such.

What is claimed is:

1. A compensation device for compensating for leakage currents, which compensation device has a differential current measuring device, a supply network detection device, a control device, an amplifier, a compensation current selection device and a feed-in device,
   the differential current measuring device being designed to capture a first signal characterizing the differential current of the active conductors and to supply the first signal to the control device,
   the supply network detection device being designed to generate a second signal characterizing the supply network connected to the active conductors and to supply the second signal to the control device,
   the control device being designed to generate a compensation preset signal suitable for the compensation from the first signal and to supply the compensation preset signal to the amplifier,
   the amplifier is designed to generate a compensation current on the basis of the compensation preset signal,
   the feed-in device is designed to feed in the compensation current on at least two different active conductors,
   the compensation current selection device is designed to feed in the compensation current on the basis of a third signal on at least one of the at least two different active conductors,
   and the control device is designed to generate the third signal on the basis of the second signal to select at least one active conductor suitable for the connected supply network for the feed-in operation.

2. The compensation device of claim 1, wherein the supply network detection device has at least one voltage measuring device and measures the voltage on at least one of the active conductors using the at least one voltage measuring device to detect the connected supply network.

3. The compensation device of claim 1, further comprising a safety device, with a switch that is connected, on the input side, to a first line, the first line being connected to the amplifier, and the switch is designed to connect the first line either to a second line in a first state or to a third line in a second state, wherein the second line is connected to a protective conductor connection, the third line is connected to the compensation current selection device, and the switch can be controlled by the control device.

4. The compensation device of claim 3, in which the switch is a relay.

5. The compensation device of claim 3, in which the control device is designed to enable a functional test, during which functional test the control device controls the switch so that the switch is in the first state, and during the functional test the control device supplies a compensation preset signal to the amplifier, the preset signal causes a compensation current to check the function of the amplifier without feeding in the compensation current via the feed-in device.

6. The compensation device of claim 3, wherein, before a supply network is connected to the active conductors, the control device changes the switch to the first state, and changes the switch to the second state only under predefined conditions that comprise the supply network being connected to the active conductors and the third signal being generated on the basis of the second signal.

7. The compensation device of claim 3, wherein the first line is connected to the third line via a capacitor for transmitting pulses that occur on the third line, to the first line even in the first state of the switch.

8. The compensation device of claim 1, further comprising a compensation current measuring device to measure the compensation current, to generate a fourth signal characterizing this compensation current and to supply the fourth signal to the control device.

9. The compensation device of claim 1, which, if a supply network having a neutral conductor is detected by the supply network detection device, controls the compensation current selection device in such a manner that the compensation current is fed in by the feed-in device on that active conductor to which the neutral conductor is connected.

10. A vehicle comprising: a charging device for a load, the charging device having a rectifier and a load connected directly or indirectly to the rectifier, the load being coupled electrically to the active conductors, and the charging device having the compensation device of claim 1, the load being a traction battery.

11. The vehicle of claim 10, further comprising an EMC filter between the rectifier and the load.

* * * * *